US008603846B2

(12) United States Patent
Cohen et al.

(10) Patent No.: US 8,603,846 B2
(45) Date of Patent: Dec. 10, 2013

(54) PROCESSING FOR OVERCOMING EXTREME TOPOGRAPHY

(75) Inventors: Guy A. Cohen, Mohegan Lake, NY (US); Steven A. Cordes, Yorktown Heights, NY (US); Sherif A. Goma, White Plains, NY (US); Joanna Rosner, Cortlandt Manor, NY (US); Jeannine M. Trewhella, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/024,711

(22) Filed: Feb. 10, 2011

(65) Prior Publication Data

US 2011/0130005 A1 Jun. 2, 2011

Related U.S. Application Data

(62) Division of application No. 12/538,515, filed on Aug. 10, 2009, now Pat. No. 7,915,064, which is a division of application No. 10/889,437, filed on Jul. 12, 2004, now abandoned.

(51) Int. Cl.
*H01L 21/00* (2006.01)

(52) U.S. Cl.
USPC ............................. 438/43; 438/687; 438/697

(58) Field of Classification Search
None
See application file for complete search history.

(56) References Cited

U.S. PATENT DOCUMENTS

| 4,090,006 A | 5/1978 | Havas et al. |
| 4,145,459 A | 3/1979 | Goel |
| 4,243,474 A | 1/1981 | Shirai et al. |
| 4,275,286 A | 6/1981 | Hackett, Jr. |
| 4,279,690 A | 7/1981 | Dierschke |
| 4,327,247 A | 4/1982 | Mituhashi et al. |
| 4,334,349 A | 6/1982 | Aoyama et al. |
| 4,400,257 A | 8/1983 | Taylor |
| 4,459,321 A * | 7/1984 | Kim .............................. 427/63 |
| 4,497,684 A * | 2/1985 | Sebesta ........................ 438/314 |

(Continued)

FOREIGN PATENT DOCUMENTS

| GB | 2172747 | 9/1986 |
| JP | 57109340 | 7/1982 |

(Continued)

OTHER PUBLICATIONS

Abstracted-Pub-No. KR2001001600A, Jan. 5, 2001; Derwent-Acc-No. 2001-481104; Derwent-week:200353; Title: Flip chip bonding method; Inventor: Jun, D.S.; Patent-Assignee: Amkor Technology Korea Inc[Amkon]; 1 page drawing.

*Primary Examiner* — David E Graybill
(74) *Attorney, Agent, or Firm* — Scully, Scott, Murphy & Presser, P.C.; Daniel P. Morris, Esq.

(57) ABSTRACT

A process for overcoming extreme topographies by first planarizing a cavity in a semiconductor substrate in order to create a planar surface for subsequent lithography processing. As a result of the planarizing process for extreme topographies, subsequent lithography processing is enabled including the deposition of features in close proximity to extreme topographic surfaces (e.g., deep cavities or channels) and, including the deposition of features within a cavity. In a first embodiment, the process for planarizing a cavity in a semiconductor substrate includes the application of dry film resists having high chemical resistance. In a second embodiment, the process for planarizing a cavity includes the filling of cavity using materials such as polymers, spin on glasses, and metallurgy.

5 Claims, 4 Drawing Sheets

(56) References Cited

U.S. PATENT DOCUMENTS

| | | | |
|---|---|---|---|
| 4,533,430 A | 8/1985 | Bower | |
| 4,533,624 A | 8/1985 | Sheppard | |
| 4,551,905 A | 11/1985 | Chao et al. | |
| 4,584,761 A | 4/1986 | Wu | |
| 4,608,493 A | 8/1986 | Hayafuji | |
| 4,635,090 A | 1/1987 | Tamaki et al. | |
| 4,670,297 A | 6/1987 | Lee et al. | |
| 4,687,730 A | 8/1987 | Eron | |
| 4,692,205 A | 9/1987 | Sachdev et al. | |
| 4,700,462 A * | 10/1987 | Beaubien et al. | 438/574 |
| 4,703,256 A | 10/1987 | Hayafuji | |
| 4,729,967 A | 3/1988 | Armiento | |
| 4,733,283 A | 3/1988 | Kuroda | |
| 4,855,017 A | 8/1989 | Douglas | |
| 4,912,545 A * | 3/1990 | Go | 257/737 |
| 5,130,764 A | 7/1992 | Cetronio et al. | |
| 5,244,143 A | 9/1993 | Ference et al. | |
| 5,256,565 A | 10/1993 | Bernhardt et al. | |
| 5,270,228 A | 12/1993 | Ishikawa | |
| 5,277,749 A | 1/1994 | Griffith et al. | |
| 5,288,660 A | 2/1994 | Hua et al. | |
| 5,338,703 A * | 8/1994 | Matsuoka | 438/577 |
| 5,360,698 A | 11/1994 | Hanrahan | |
| 5,385,851 A * | 1/1995 | Misawa et al. | 438/571 |
| 5,395,739 A | 3/1995 | Nakatani et al. | |
| 5,408,742 A | 4/1995 | Zaidel et al. | |
| 5,436,201 A | 7/1995 | Chi et al. | |
| 5,486,449 A | 1/1996 | Hosono et al. | |
| 5,503,961 A | 4/1996 | Linde et al. | |
| 5,547,789 A | 8/1996 | Nakatani et al. | |
| 5,556,797 A | 9/1996 | Chi et al. | |
| 5,571,376 A | 11/1996 | Bestwick et al. | |
| 5,587,328 A | 12/1996 | Yoshida | |
| 5,641,611 A * | 6/1997 | Shieh et al. | 430/321 |
| 5,673,846 A | 10/1997 | Gruber | |
| 5,677,574 A | 10/1997 | Hisaka | |
| 5,773,333 A * | 6/1998 | Jo | 438/179 |
| 5,814,924 A | 9/1998 | Komatsu | |
| 5,953,587 A | 9/1999 | Forrest et al. | |
| 5,971,058 A | 10/1999 | Bolde et al. | |
| 6,013,538 A | 1/2000 | Burrows et al. | |
| 6,037,245 A | 3/2000 | Matsuda | |
| 6,046,100 A | 4/2000 | Ramaswami et al. | |
| 6,071,752 A | 6/2000 | Furlani et al. | |
| 6,121,152 A | 9/2000 | Adams et al. | |
| 6,132,586 A | 10/2000 | Adams et al. | |
| 6,143,155 A | 11/2000 | Adams et al. | |
| 6,158,650 A | 12/2000 | Holzmann | |
| 6,162,723 A | 12/2000 | Tanaka | |
| 6,205,656 B1 * | 3/2001 | Adams et al. | 29/840 |
| 6,208,016 B1 | 3/2001 | Farrar | |
| 6,211,049 B1 | 4/2001 | Farrar | |
| 6,231,333 B1 | 5/2001 | Gruber et al. | |
| 6,242,293 B1 | 6/2001 | Danzilio | |
| 6,271,110 B1 | 8/2001 | Yamaguchi et al. | |
| 6,288,442 B1 | 9/2001 | Farrar | |
| 6,307,221 B1 | 10/2001 | Danzilio | |
| 6,386,436 B2 | 5/2002 | Hembree | |
| 6,390,439 B1 * | 5/2002 | Cordes et al. | 249/119 |
| 6,394,334 B1 * | 5/2002 | Brouillette et al. | 228/33 |
| 6,407,408 B1 * | 6/2002 | Zhou et al. | 257/40 |
| 6,426,241 B1 * | 7/2002 | Cordes et al. | 438/108 |
| 6,426,273 B1 * | 7/2002 | Yanagida | 438/449 |
| 6,452,117 B2 | 9/2002 | Curcio et al. | |
| 6,455,921 B1 | 9/2002 | Ramaswami et al. | |
| 6,461,136 B1 | 10/2002 | Gruber et al. | |
| 6,502,930 B1 | 1/2003 | Shimada et al. | |
| 6,518,071 B1 | 2/2003 | Durlam et al. | |
| 6,524,937 B1 | 2/2003 | Cheng et al. | |
| 6,527,158 B1 * | 3/2003 | Brouillette et al. | 228/33 |
| 6,528,346 B2 | 3/2003 | Ochiai et al. | |
| 6,552,432 B2 | 4/2003 | Farrar | |
| 6,562,642 B1 | 5/2003 | Cohen et al. | |
| 6,566,612 B2 * | 5/2003 | Brouillette et al. | 174/263 |
| 6,581,280 B2 | 6/2003 | Curcio et al. | |
| 6,630,741 B1 | 10/2003 | Lopatin et al. | |
| 6,645,819 B2 | 11/2003 | Pullela | |
| 6,656,750 B1 * | 12/2003 | Datta et al. | 438/14 |
| 6,700,748 B1 * | 3/2004 | Cowles et al. | 360/245.9 |
| 6,708,868 B1 | 3/2004 | Pilat et al. | |
| 6,708,873 B2 | 3/2004 | Gruber et al. | |
| 6,713,827 B2 | 3/2004 | Cohen et al. | |
| 6,720,200 B2 | 4/2004 | Yamaguchi et al. | |
| 6,784,081 B1 | 8/2004 | Hsu et al. | |
| 6,798,064 B1 | 9/2004 | Henry et al. | |
| 6,803,312 B2 | 10/2004 | Sato | |
| 6,807,353 B1 | 10/2004 | Fleming | |
| 6,832,747 B2 * | 12/2004 | Cordes et al. | 249/119 |
| 6,849,927 B2 | 2/2005 | Farrar | |
| 6,852,487 B1 | 2/2005 | Barany et al. | |
| 6,885,150 B2 | 4/2005 | Guenther | |
| 6,919,211 B1 | 7/2005 | Fodor et al. | |
| 6,951,682 B1 | 10/2005 | Zebala | |
| 6,955,915 B2 | 10/2005 | Fodor et al. | |
| 6,967,136 B2 | 11/2005 | Alatsu et al. | |
| 7,083,917 B2 | 8/2006 | Barany et al. | |
| 7,087,533 B2 | 8/2006 | Chung | |
| 7,176,106 B2 * | 2/2007 | Snyder et al. | 438/455 |
| 7,202,553 B2 * | 4/2007 | Snyder et al. | 257/678 |
| 7,211,512 B1 | 5/2007 | Ahn et al. | |
| 7,320,174 B2 * | 1/2008 | Cowles et al. | 29/852 |
| 7,449,098 B1 | 11/2008 | Mayer et al. | |
| 2001/0010403 A1 | 8/2001 | Farrar | |
| 2002/0014836 A1 | 2/2002 | Codama et al. | |
| 2002/0020920 A1 | 2/2002 | Farrar | |
| 2002/0062556 A1 * | 5/2002 | Brouillette et al. | 29/832 |
| 2002/0106884 A1 | 8/2002 | Ahn et al. | |
| 2002/0106890 A1 | 8/2002 | Ahn et al. | |
| 2002/0113324 A1 * | 8/2002 | Cordes et al. | 257/784 |
| 2002/0125402 A1 * | 9/2002 | Cordes et al. | 249/119 |
| 2002/0127844 A1 * | 9/2002 | Grill et al. | 438/622 |
| 2002/0166838 A1 | 11/2002 | Nagarajan | |
| 2003/0139036 A1 | 7/2003 | Sato | |
| 2003/0148548 A1 | 8/2003 | Cohen et al. | |
| 2003/0157775 A1 | 8/2003 | Kurokawa et al. | |
| 2003/0173584 A1 | 9/2003 | Nikaido | |
| 2004/0032456 A1 | 2/2004 | Ramaswami et al. | |
| 2004/0082159 A1 | 4/2004 | Shieh et al. | |
| 2004/0087046 A1 * | 5/2004 | Datta et al. | 438/14 |
| 2004/0094511 A1 | 5/2004 | Seo et al. | |
| 2004/0152011 A1 | 8/2004 | Chen et al. | |
| 2004/0155342 A1 | 8/2004 | Usami et al. | |
| 2004/0187296 A1 * | 9/2004 | Cowles et al. | 29/603.07 |
| 2004/0188502 A1 * | 9/2004 | Mori et al. | 228/248.1 |
| 2004/0203224 A1 | 10/2004 | Halahan et al. | |
| 2004/0212086 A1 * | 10/2004 | Dotta et al. | 257/737 |
| 2004/0239729 A1 | 12/2004 | Kim et al. | |
| 2004/0246310 A1 | 12/2004 | Shin et al. | |
| 2004/0251524 A1 * | 12/2004 | Snyder et al. | 257/678 |
| 2004/0253765 A1 * | 12/2004 | Snyder et al. | 438/113 |
| 2005/0023699 A1 | 2/2005 | Ahn et al. | |
| 2005/0026382 A1 | 2/2005 | Akatsu et al. | |
| 2005/0034822 A1 | 2/2005 | Kim et al. | |
| 2005/0072919 A1 | 4/2005 | Meyer et al. | |
| 2005/0127529 A1 * | 6/2005 | Huang et al. | 257/779 |
| 2005/0224992 A1 * | 10/2005 | Rochette | 257/784 |
| 2005/0233320 A1 | 10/2005 | Barany et al. | |
| 2006/0009038 A1 | 1/2006 | Cohen et al. | |
| 2006/0046446 A1 | 3/2006 | Kon et al. | |
| 2006/0091780 A1 | 5/2006 | Minami | |
| 2006/0275949 A1 * | 12/2006 | Farnworth et al. | 438/106 |
| 2007/0085213 A1 | 4/2007 | Ahn et al. | |
| 2007/0167005 A1 | 7/2007 | Ahn et al. | |
| 2009/0298292 A1 | 12/2009 | Cohen et al. | |

FOREIGN PATENT DOCUMENTS

| | | |
|---|---|---|
| JP | 03171741 | 7/1991 |
| JP | 04111422 | 4/1992 |
| JP | 05152346 | 6/1993 |

* cited by examiner

PROCESSING FOR OVERCOMING EXTREME TOPOGRAPHY

RELATED APPLICATIONS

This application is a divisional of U.S. application Ser. No. 12/538,515 filed Aug. 10, 2009; which is a division of U.S. application Ser. No. 10/889,437, filed Jul. 12, 2004.

BACKGROUND

1. Field of the Invention

This invention presents novel processing techniques to overcome lithography issues on extreme topography, particularly, in applications including the fabrication of micromachined structures such as those traditionally characterized as microelectro-mechanical structures (MEMS), including chemical sensors, pressure and temperature sensors, shock sensors, and silicon optical benches, etc.

2. Description of the Prior Art

MEMs devices typically merge the fields of macrodevices produced by conventional mechanical machining and electronics design with the field of microfabrication, similar to those used in semiconductor processing. MEMs devices, typically characterized as devices ranging from a few microns to several mils in size, are fabricated using semiconductor technology, but with larger ground rules. Dimensions are typically larger in width and length, but also 10× to 100× greater in height. The primary challenge associated with fabricating MEMs devices, therefore, is photolithography, where a non-planar surface is known to be problematic. A complete MEMs device typically will require several levels of lithography. These multi-level structures inherently result in surfaces with topography, originating from wet chemical etching, reactive ion etching, and metal deposition to name a few. Topography may range from a few microns to hundreds of microns. This topography hampers the ability to produce fine lines as the photoresist has to be made quite thick, approximately equal to the topography of the device, in order to get continuous coverage over the topography.

Anisotropically etched silicon cavities produce cavities with edges with abrupt, sharp interfaces at the wafer surface, making use of conventional spin coated photoresists difficult. As shown in FIG. 1, liquid resist coatings 18 on deep cavities, such as anisotropically etched cavities 12 and 15 formed in substrate 10 such and ranging from about several microns to several mils in depth, results in cavity bottoms coated (3× to 10×) thicker than the majority of the surface of the wafer. Second, resist coatings are much thinner (0× to 0.1×) at the rim of a cavity than on the majority of the surface of the wafer, making the rim around any cavity susceptible to undesirable etching or deposition. Thinner resist will produce extremely non-uniform coverage, and in most cases voiding such as shown at locations 16 indicated in FIG. 1. This voiding, located in the proximity of the cavities, leaves the surface of the substrate unprotected by the photoresist, rendering the lithography at the perimeter of the cavities ineffective.

This is a well documented problem. The most common technique employed to overcome this challenge is spray coating of the photoresist. Spray coating has several drawbacks. In order to build the most uniform coating as a thin film, the spray must be done as a mist. A fine mist is susceptible to drying into particulates, which present an entirely new set of problems. Therefore, there is a tradeoff between film thickness and cleanliness, and therefore the film thickness creates a limitation for the lithography. In addition, since the photoresist is a liquid, it will still flow and pile in the bottom of the cavities, which can cause other processing complications.

A second prior art method of addressing extreme topography is to apply multiple layers of photoresist. However, this only solves coverage on the rim. Resist non-uniformities continue to be problematic. Such resist non-uniformities affect the focal depth of the exposure tool and inherently impact the final feature resolution since some features are in focus while others are not. To maintain feature resolution and eliminate issues with focal depth, it is desirable to perform lithography with a uniform resist coating. A level imagining resist plane can be formed using a dry film laminate resist.

Manual techniques for applying beads of photoresist to the rim of the cavities to eliminate voiding have also been investigated. This technique is very costly and slow, and still does not enable images to be placed close to the perimeter of the cavity.

It would be highly desirable to provide a process that essentially planarizes a semiconductor substrate having an extreme topographic surface feature such as a deep cavity in order to create a planar surface for subsequent lithography processing. The planarizing materials may then be removed after lithography.

It would further be highly desirable to provide a process that essentially planarizes a semiconductor substrate having an extreme topographic surface feature such as a deep cavity in order to create a planar surface for subsequent lithography processing including the deposition of features in close proximity to the extreme topographic surface feature (e.g., deep cavity or channel) and, including the deposition of features within the cavity.

SUMMARY

The present invention is directed to a process that essentially planarizes a cavity in a semiconductor substrate in order to create a planar surface for subsequent lithography processing. As a result of the planarizing process for extreme topographies, subsequent lithography processing is enabled including the deposition of features in close proximity to extreme topographic surfaces (e.g., deep cavities or channels) and, including the deposition of features within a cavity.

In a first embodiment, the process for planarizing a cavity in a semiconductor substrate in order to create a planar surface for subsequent lithography processing includes the application of a dry laminate resist.

In a second embodiment, the process for planarizing a cavity in a semiconductor substrate in order to create a planar surface for subsequent lithography processing includes the filling of cavity using materials such as polymers, spin on glasses, and metallurgy.

According to one aspect of the invention, there is provided a method for planarizing extreme topographies on a surface of a semiconductor substrate including at least one deep cavity or channel, the method comprising: providing a thick resist film to bridge said cavity or channel to enable patterning on the surface of a substrate. According to this aspect of the invention, the method for planarizing extreme topographies further includes the formation of a liftoff structure including: patterning a feature over the thick resist film bridge; developing the thick resist film pattern feature to produce an overhang structure including an opening; and, depositing a material on a lower surface of the cavity or channel through the opening.

According to another aspect of the invention, there is provided a method for planarizing extreme topographies on a surface of a semiconductor substrate including at least one deep cavity or channel, the method comprising providing a planarizing material atop the surface including filling the at least one deep cavity or channel with the planarizing material to produce a planarized surface without need for a chemical mechanical polish (CMP) step. According to this aspect of the invention, the method for planarizing extreme topographies further includes the step of forming a liftoff structure including: patterning a feature over the filled at least one cavity or channel using a mask structure; etching away the planarizing fill material from the cavity or channel according to the patterned feature to produce an overhang structure including an opening atop the cavity or channel; and, depositing a material on a lower surface of the cavity or channel through the opening.

BRIEF DESCRIPTION OF THE DRAWINGS

Further features, aspects and advantages of the structures and methods of the present invention will become better understood with regard to the following description, appended claims, and accompanying drawings where:

DETAILED DESCRIPTION

Figure 1:
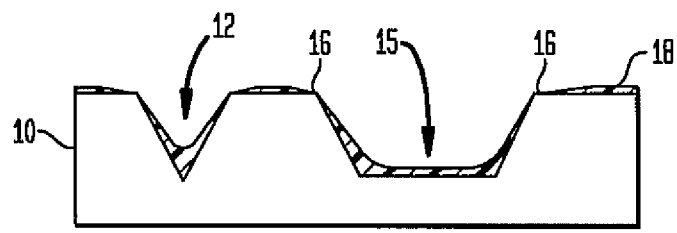
FIG. 1 illustrates a conventional deposition process of applying a thin resist material on extreme topography according to the prior art where use of thinner resist produces extremely non-uniform coverage, and voiding.
Figure 2:
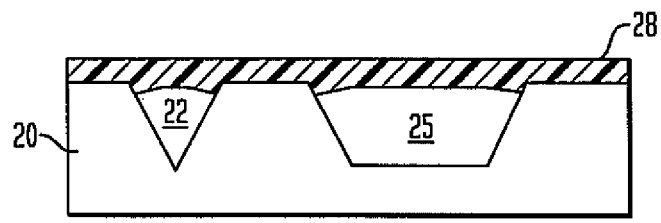
FIG. 2 illustrates the structure after applying a thick laminate resist film that results in bridging across topographic cavities 22 or channels 25 formed in substrate 20 according to a first embodiment of the invention.
Figure 3:
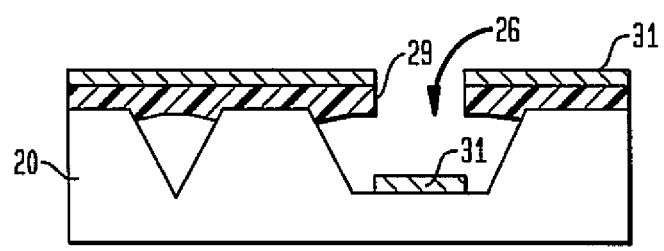
FIG. 3 illustrates the fabrication of a liftoff type structure by producing an overhang structure over the cavity according to a first embodiment of the invention.

Laminate resists are thick film resists which are typically designed for plating and chemical etch processes due to their high chemical resistance, e.g., Dupont Riston®, and the like. These films may be applied in sheet form through a heated roller according to known techniques. For this reason, as shown in FIG. 2, the thickness of the laminate resist films 28 is constant and results in bridging across topographic features such as cavities 22 or channels 25 formed in substrate 20. This process allows for imaging on the surface of the substrate, patterning metallization or additional cavity structures. Alternately, an overhang structure may be created, for example, by patterning the resist layer and developing the resist in order to create an opening 26 in the resist layer 28. That is, the laminate resist film 28 can be used for patterning liftoff type structures into the cavities 22 or channels 25 by producing an overhang structure 29, used as part of a process for depositing a metal 31 such as shown in FIG. 3. This technique provides the ability to protect the edge of cavities, and even pattern within the cavity. The approximate minimum thickness of a laminate resist may range between 15 μm and 100 μm with a minimum feature resolution of about 20 μm.

An alternative, novel processing technique that offers a reduction in the size of the critical dimension uses a temporary fill material to level the imaging plane and eliminates the topography, allowing for the use of liquid resists. Conformal coverage of the wafer surface with the liquid resists also allows for the flexibility of using both a wet chemical etch and dry etch approach for material removal, specifically for extreme topographies. Whereas, a laminate resist used over deep cavities is limited to dry etch processing only.

Figure 4:
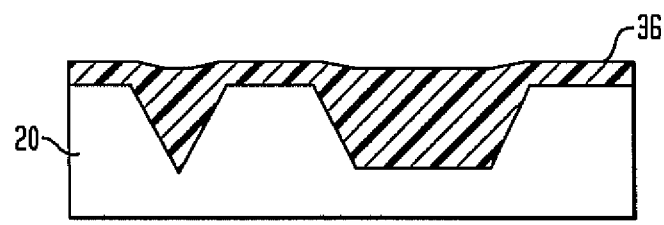
FIG. 4 depicts the filling of cavities with a highly planarizing material and leaving a film on the surface of the substrate according to the second embodiment of the invention.
Figure 5:
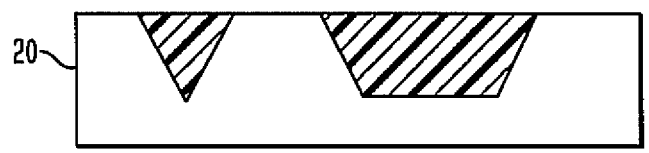
FIG. 5 depicts the resulting structure of when the planarizing material 36 is polished off the surface of the substrate, while leaving it in the cavities; and, FIGS. 6(a)-6(c) illustrate steps for patterning a layer using conventional lithographic and etching techniques for fabricating a liftoff structure according to the second embodiment of the invention.

The thickness of the photoresist directly scales to the minimum feature resolution. Therefore, according to this further embodiment of the present invention, a fill material is used so that liquid resists can be utilized for lithography. Two potential methods for filling cavities are now described:

A first novel approach involves filling the cavity with a liquid material as shown in FIG. 4, such as by spin coating of a highly planarizing material 36 (e.g., polymers, spin on glasses) or by squeegee technique. This will fill most or all of the cavity volume, leaving a film on the surface of the substrate as shown in FIG. 4. In most cases, the surface of the substrate will need to be removed in order to allow the completion of subsequent layers of processing. This will best be accomplished by chemical-mechanical polishing (CMP) which will polish the planarizing material 36 off the surface of the substrate, while leaving it in the cavities 22, 25 as shown in FIG. 5. Depending on the planarizing material, CMP may cause dishing in the cavities, but the dishing is a gradual topography, typically on the order of about 1 μm-3 μm. At this point, the wafer is processed using conventional processing techniques without the concern of the extreme topography. After processing is complete, the planarizing material 36 is stripped from the cavities.

2) A second novel approach in planarizing a wafer surface with extreme topography is to utilize metallurgy as the filler material. An exemplary filler material is defined as one that levels the wafer plane without any discernible topography. Polymers or spin glasses can accomplish planarization, however, the planarizing ability of these materials is compromised as result of solvent loss during the curing steps, resulting in some dimpling at the cavity site. Metallurgy such as Copper, or other materials such as tin-based solder or nickel has exceptional planarizing characteristics when chemically, mechanically polished.

A planarized wafer surface will improve the uniformity of photoresist coatings. With improved resist uniformity, resolution of fine features along a cavity edge can be drastically improved. A highly planarizing material such as Copper is critical in subsequent processing of metal leads, bonding pads, and alignment marks on the substrate surface.

Copper plating can be used to fill cavities both electrolessly and electrolitically. To accomplish filling the cavities with the electroless technique, a metal evaporation mask can be used to fill the cavities with a plating seed layer, consisting of chrome or titanium adhesions layer with a thin copper film. Once the seed layer is in place, the cavity is plated with copper just over the cavity edge. The wafer is then planarized using chemical mechanical polishing.

Additional techniques that can be used to fill the cavities include screening of metal containing pastes, such as copper, solder or other like materials, possibly including glass particles to improve CMP. This process also suffers from shrinkage, but is also within an acceptable range as to provide gentle slopes for uniform resist coating. A similar technique employs an injection molded solder, which utilizes a heated injection head to screen molten solder. That is, a screening technique or molten solder screening technique familiar to skilled artisans may be used to fill a cavity, such as a copper or solder paste to produce a planarized surface without CMP.

Figure 6A:
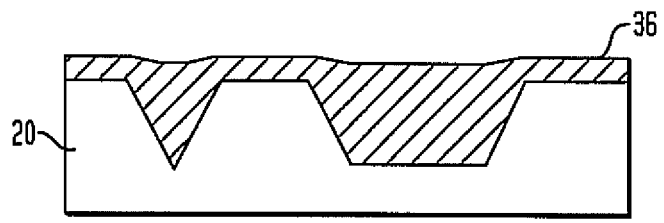
Figure 6B:
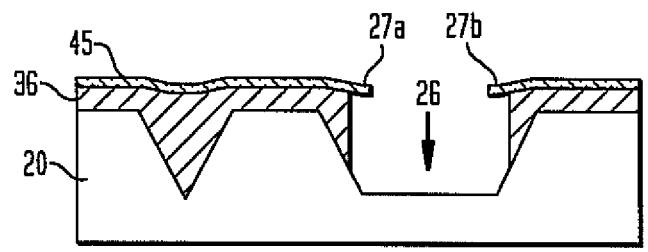
Figure 6C:
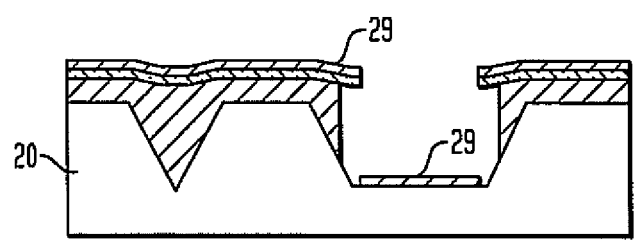

Each of the processes described herein additionally allow for liftoff structures such as may be used for depositing images into the cavity, onto the surface of the wafer, and along the slope of the cavity. Depending on where the images are required, CMP may or may not be required to facilitate this process. In either case, a hard mask (such as a metal or oxide layer) is deposited on the planarizing material. This layer is patterned using conventional lithographic and etching techniques such as shown in FIGS. 6(a)-6(c). This mask will serve as a RIE mask, in such a way as to allow a cavity to be produced under this hard mask.

For instance, as shown in the exemplary embodiment of FIG. 6(a), cavity planarization is provided, for example, using a metallurgy fill material 36 such as Cu that fills channel/cavities 22 and 25. Other types of "liftoff" material may be used including photoresist, polyimide, or spin on glass. Then, although not shown, a continuous hard mask coating 45 such as a dielectric (oxide) or metal is applied over the surface of the cavity fill layer. Then, implementing an etching process, the hard mask 45 is patterned utilizing a wet or dry etch to form an opening 26 in the hard mask layer above the cavity. Then, the cavity fill is etched away to result in the structure as shown in FIG. 6(b) that includes an overhang structure 27a,b provided above the cavity. For example, a reactive ion etch (RIE) technique may be used to produce the opening 26 in channel 25. Then, a material layer 29 such as may be deposited using PVD (Physical Vapor Deposition) including, but not limited to, metals, (e.g., copper, aluminum, gold) and dielectrics (e.g., silicon dioxide, silicon nitride), is deposited that lands in the bottom of the channel/cavity 25 to form the desired feature. These feature materials may be deposited using a "line-of-sight" deposition process for example. Etch techniques known to skilled artisans, e.g., dry and wet etches, whether applied individually or in conjunction, may be used to: contour the overhang profile, and contour the undercut of cavity fill under the hard mask and the depth and abruptness of the edges of remaining cavity fill. Finally, the liftoff structure (cavity fill and hard mask) is removed in a subsequent process step utilizing conventional techniques.

Figure 8A:
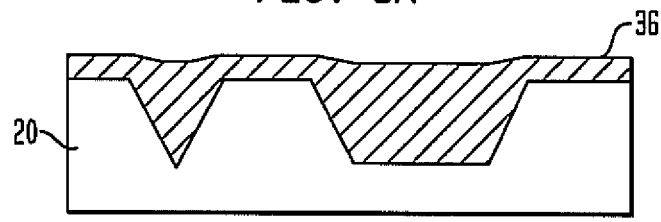
Figure 8B:
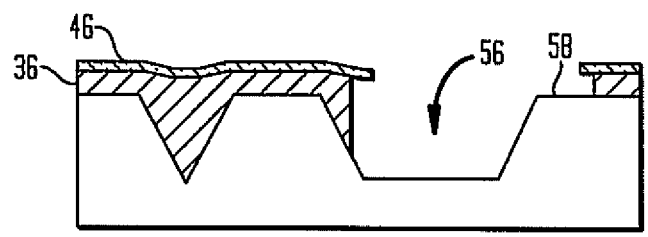
Figure 8C:
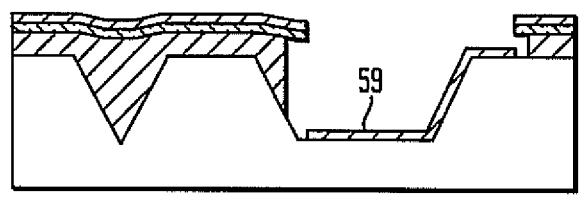
Figure 8D:
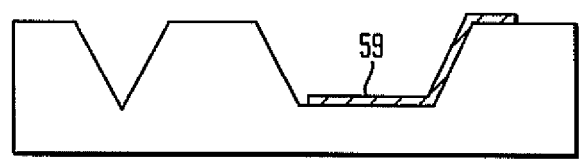
Figure 8E:
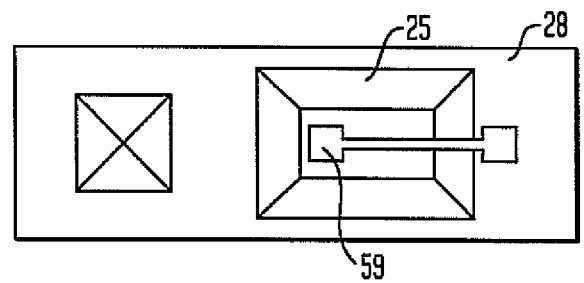

FIGS. 8(a)-8(e) illustrate steps for patterning a layer using conventional lithographic and etching techniques for fabricating a variation of the liftoff structure according to the second embodiment of the invention. In this alternate embodiment, the processes described herein allow for liftoff structures such as may be used for depositing images into the cavity, onto the surface of the wafer, and along the slope of the cavity. FIG. 8(a) illustrates a metallurgy or polymer fill material 36 such as Cu or photoresist that fills a cavity, and FIG. 8(b) illustrates the coating and patterning of a hard mask 46 utilizing a reactive ion etch (RIE) technique in the manner described herein. However, in the embodiment of FIG. 8(b) the etching is performed to provide opening 56 that extends outside the cavity over a portion of the substrate surface 58. It is understood that the opening 56 depicted in FIG. 8(b) is for illustrative purposes, and the opening 56 may extend outside the cavity to the other side or, extend outside the cavity over both sides of the substrate surface. Then, as shown in FIG. 8(c), liftoff material layer 59 is deposited through the formed opening 56 to form a material layer inside the cavity that extends along the slope of the cavity or channel to the substrate surface 58. Finally, the remaining liftoff material, hardmask and cavity fill material is removed to result in the structure shown in FIG. 8(d). The resulting top plan view of the resulting liftoff material feature extending from outside the cavity to the inside according to this embodiment is shown in FIG. 8(e). Thus, when viewing the resulting structure according to FIG. 8(e), an electrical connection may be formed from the top surface (above a cavity) to the bottom of the cavity along the cavity (or channel) sidewalls. The process implementing this is identical to those of the embodiments described herein, however, the cavity fill material is selectively removed, using the etch of the cavity fill, so that deposited material 29 in the cavity 25 will travel up the sidewall and only a small amount of fill would be removed at the top so that the deposited feature forms on the slope of the cavity.

Figure 7:
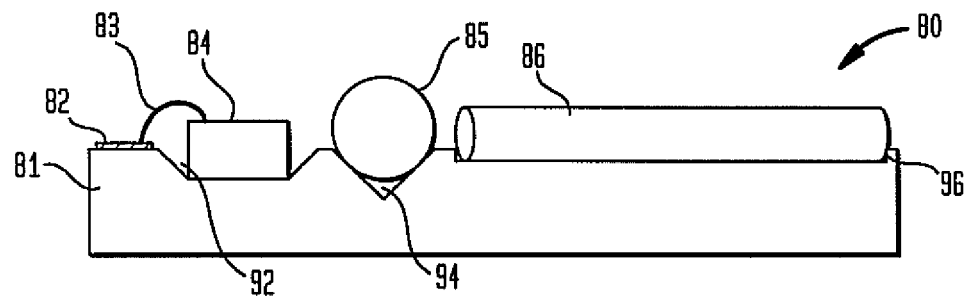
FIG. 7 shows an example configuration of a silicon optical bench 80 formed in accordance with the techniques of the present invention; and, FIGS. 8(a)-8(e) illustrate steps for patterning a layer using conventional lithographic and etching techniques for fabricating a variation of the liftoff structure according to the second embodiment of the invention.

The techniques of the present invention may be used, for example, in the formation of an optical bench, an exemplary application of which is depicted in FIG. 7. In such optical bench application, deep cavities are etched to support lenses that are aligned to a laser and an optical cable. Light created from a laser is focused through a lens into a optical fiber, while being monitored by a photo diode. The alignment of the optical bench components such as the laser, lens, optical fiber, and photo diode are critical to the efficiency of the optical system.

A typical configuration for a silicon optical bench 80 such as shown in FIG. 7 might consist of semiconductor laser 84 connected with a wire bond lead to an electrical connection pad 82. Semiconductor laser 84 may further be bonded with a patterned bonding metallurgy underneath the laser inside the etched cavity 92 on a silicon wafer 81. For example, such a cavity 92 may be formed in substrate having a depth of about 250 μm. Utilizing techniques of the invention, further electrical and mechanical connections to the laser 84 may be formed e.g., via a pad that must be patterned, at the bottom of the cavity 92. Further patterns may be etched independently, for example, at the bottom of cavities 94 and 96 to provide mechanical and electrical connections to each of the other devices including optical lens 85 and optical fiber 86, respectively. That is, adjacent to the laser 84 may be a lens 85 to collect the light, and focus it into a fiber 86. The lens 85 will be recessed in an etched cavity 94 similar to the laser 84, but almost certainly at a different depth, e.g., about 350 μm. Beyond the lens 85, opposite the laser 84, is the optic fiber 86 that is to be held in an etched channel 96 at a different depth, e.g., about 200 μm. Each of these etched features generally require individual lithographic and chemical etch steps as the etch conditions and times are unique. Additional processing steps would be required for other possible features such as bonding or interconnect metallization, other unique thin film components, or other etched features including photodiodes for measuring laser signals.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for planarizing topographies on a surface of a semiconductor substrate including at least one cavity or channel ranging from several microns to several mils in depth, said method comprising:

providing a planarizing material atop said surface including filling said at least one cavity or channel with said planarizing material to produce a planarized surface, patterning a feature over said filled at least one cavity or channel using a mask structure;

etching away the planarizing fill material from said cavity or channel according to said patterned feature to produce an overhang structure including an opening atop said cavity or channel; and, depositing a material on a lower surface of said cavity or channel through said opening, wherein said step of filling said at least one cavity or channel with said planarizing material includes implementing a screening technique.

2. A method for planarizing topographies on a surface of a semiconductor substrate including at least one cavity or channel ranging from several microns to several mils in depth, said method comprising:

providing a planarizing material atop said surface including filling said at least one cavity or channel with said planarizing material to produce a planarized surface, patterning a feature over said filled at least one cavity or channel using a mask structure;

etching away the planarizing fill material from said cavity or channel according to said patterned feature to produce an overhang structure including an opening atop said cavity or channel; and, depositing a material on a lower surface of said cavity or channel through said opening, wherein said planarizing material includes a metallurgy fill material.

3. The method for planarizing topographies as claimed in claim 2, wherein said metallurgy fill material includes copper.

4. The method for planarizing topographies as claimed in claim 2, wherein said metallurgy fill material includes solder paste.

5. The method for planarizing topographies as claimed in claim 1, wherein said step of filling said at least one cavity or channel with said planarizing material includes implementing a molten solder screening technique.

* * * * *